(12) United States Patent
Lee et al.

(10) Patent No.: US 11,874,329 B2
(45) Date of Patent: Jan. 16, 2024

(54) SERVER AND CONTROL METHOD FOR THE SAME

(71) Applicants: Hyundai Motor Company, Seoul (KR); Kia Motors Corporation, Seoul (KR)

(72) Inventors: Jong Bok Lee, Yongin-si (KR); Minjae Park, Seongnam-si (KR); Seunghyun Woo, Seoul (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 434 days.

(21) Appl. No.: 17/092,564

(22) Filed: Nov. 9, 2020

(65) Prior Publication Data

US 2021/0349153 A1  Nov. 11, 2021

(30) Foreign Application Priority Data

May 7, 2020 (KR) .................. 10-2020-0054648

(51) Int. Cl.
| | |
|---|---|
| *G01R 31/3835* | (2019.01) |
| *G01R 31/367* | (2019.01) |
| *G01R 31/392* | (2019.01) |
| *G06Q 30/0645* | (2023.01) |
| *G07C 5/00* | (2006.01) |
| *G01R 31/00* | (2006.01) |
| *G01R 31/371* | (2019.01) |

(52) U.S. Cl.
CPC ....... *G01R 31/3835* (2019.01); *G01R 31/006* (2013.01); *G01R 31/371* (2019.01); *G01R 31/392* (2019.01); *G06Q 30/0645* (2013.01); *G07C 5/008* (2013.01)

(58) Field of Classification Search
CPC .. G01R 31/006; G01R 31/367; G01R 31/371; G01R 31/3835; G01R 31/392; G06Q 30/0283; G06Q 30/0631; G06Q 50/30; G07C 5/008
See application file for complete search history.

(56) References Cited

U.S. PATENT DOCUMENTS

| | | | | |
|---|---|---|---|---|
| 2013/0030581 | A1* | 1/2013 | Luke ...................... | B60L 53/68 705/14.1 |
| 2013/0085696 | A1* | 4/2013 | Xu .......................... | G06F 17/40 702/63 |
| 2018/0253789 | A1* | 9/2018 | Takatsuka ............. | H01M 10/42 |
| 2020/0326381 | A1* | 10/2020 | Matsumura ............ | G06Q 30/06 |
| 2021/0001744 | A1* | 1/2021 | Suzuki .................... | B60L 53/66 |
| 2022/0077691 | A1* | 3/2022 | Jeong ................. | H02J 7/00714 |

* cited by examiner

*Primary Examiner* — Kyle R Quigley
*Assistant Examiner* — Dacthang P Ngo
(74) *Attorney, Agent, or Firm* — Slater Matsil, LLP

(57) ABSTRACT

A server includes a communicator and a controller configured to acquire battery status information of each of a plurality of batteries through the communicator, acquire target device information from a user terminal through the communicator, determine a battery from the plurality of batteries having a lifespan corresponding to a required output of a target device among the plurality of batteries as a recommended battery based on the battery status information and the target device information, and control the communicator to transmit information on the recommended battery to the user terminal.

18 Claims, 11 Drawing Sheets

| BATTERY STATUS INFORMATION | | WEIGHT |
|---|---|---|
| NUMBER OF CHARGE /DISCHARGE | MANY TIMES | 5 |
| | MIDDLE | 3 |
| | LESS | 1 |
| USAGE HISTORY | MAINLY USED FOR ELECTRIC MOTORCYCLES | 3 |
| | MAINLY USED FOR ELECTRIC KICKBOARDS | 2 |
| | MAINLY USED FOR ELECTRIC BICYCLES | 1 |

FIG. 4

| USER INFORMATION | | BATTERY LIFESPAN (GRADE) |
|---|---|---|
| TARGET DEVICE | ELECTRIC MOTORCYCLE | A |
| | ELECTRIC KICKBOARD | B |
| | ELECTRIC BICYCLE | C |
| DRIVING HISTORY | PREFER HIGH POWER DRIVING | A |
| | PREFER MEDIUM POWER DRIVING | B |
| | PREFER LOW POWER DRIVING | C |

| BATTERY LIFESPAN (GRADE) | RENTAL FEE |
|---|---|
| A | HIGH |
| B | MIDDLE |
| C | LOW |

SERVER AND CONTROL METHOD FOR THE SAME

CROSS-REFERENCE TO RELATED APPLICATIONS

This application claims the benefit of Korean Patent Application No. 10-2020-0054648, filed on May 7, 2020, which application is hereby incorporated herein by reference.

TECHNICAL FIELD

The present disclosure relates to a server and a controlling method thereof for managing a shared battery.

BACKGROUND

Recently, as the market for personal mobility corresponding to a power-driven single-person vehicle has increased, users using personal mobilities on the road are increasing.

In addition, a battery using a secondary battery is widely used as a means of transmitting power to a personal mobility, and a replaceable battery that can be attached or detached from the main body of the personal mobility is used.

Recently, a charging station for charging a replaceable battery has been introduced, and users share and use the battery by returning the discharged battery to the charging station and obtaining the charged battery from the charging station.

SUMMARY

Embodiments of the present invention provide a battery suitable for a user according to the battery state and the type of device to be used, and a server and a control method thereof are provided that propose a redistribution area according to a battery condition.

In accordance with an embodiment of the present disclosure, a server may include a communicator and a controller configured to acquire battery status information of each of a plurality of batteries through the communicator, acquire target device information from a user terminal through the communicator, determine a battery having a lifespan corresponding to a required output of the target device among the plurality of batteries as a recommended battery based on the battery status information and the target device information, and control the communicator to transmit the recommended battery information to the user terminal.

The battery status information may include at least one of charge/discharge count information, usage history information, maximum charge capacity information, and output voltage information.

The controller may determine the lifespan of each of the plurality of batteries based on the battery status information.

The controller may receive driving history information of the user from the user terminal through the communicator.

The controller may determine a required power of the target device based on at least one of the target device information and the driving history information.

The controller may determine a battery having a lifespan corresponding to the required output of the target device and located within a preset distance from the user terminal as a recommended battery based on the location information of the user terminal.

The controller may determine a battery rental fee proportional to the lifespan.

The controller may adjust a direction in which a battery rental fee is increased when the user uses a battery having a longer lifespan than the recommended battery, and adjust the battery rental fee when the user uses a battery having a shorter lifespan than the recommended battery.

The controller may determine a target device type and usage method corresponding to each of the plurality of batteries based on the battery state information, and control the communicator to transmit the determined target device type and usage method to the user terminal.

The controller may determine a battery output state for each region based on the location information and the battery state information of each of the plurality of batteries, determine a redistribution region of each of the plurality of batteries based on the battery output state and the battery state information for each region, and control the communicator to transmit information on the redistribution region to an external device.

In accordance with an embodiment of the present disclosure, a controlling method of a server including a communicator may include acquiring battery status information of each of a plurality of batteries through the communicator, acquiring target device information from a user terminal through the communicator, determining a battery having a lifespan corresponding to a required output of the target device among the plurality of batteries as a recommended battery based on the battery status information and the target device information, and controlling the communicator to transmit the recommended battery information to the user terminal.

The battery status information may include at least one of charge/discharge count information, usage history information, maximum charge capacity information, and output voltage information.

Determining the battery as the recommended battery may include determining the lifespan of each of the plurality of batteries based on the battery status information.

The method may further include receiving driving history information of the user from the user terminal through the communicator.

Determining the battery as the recommended battery may include determining a required power of the target device based on at least one of the target device information and the driving history information.

Determining the battery as the recommended battery may include determining a battery having a lifespan corresponding to the required output of the target device and located within a preset distance from the user terminal as a recommended battery based on the location information of the user terminal.

The method may further include determining a battery rental fee proportional to the lifespan.

Determining the battery rental fee may include adjusting a direction in which a battery rental fee is increased when the user uses a battery having a longer lifespan than the recommended battery, and adjusting the battery rental fee when the user uses a battery having a shorter lifespan than the recommended battery.

The method may further include determining a target device type and usage method corresponding to each of the plurality of batteries based on the battery state information, and controlling the communicator to transmit the determined target device type and usage method to the user terminal.

The method may further include determining a battery output state for each region based on the location information and the battery state information of each of the plurality of batteries, determining a redistribution region of each of the plurality of batteries based on the battery output state and the battery state information for each region, and controlling the communicator to transmit information on the redistribution region to an external device.

BRIEF DESCRIPTION OF THE DRAWINGS

These and/or other aspects of the disclosure will become apparent and more readily appreciated from the following description of the exemplary embodiments, taken in conjunction with the accompanying drawings, in which.

DETAILED DESCRIPTION OF ILLUSTRATIVE EMBODIMENTS

Like reference numerals refer to like elements throughout. The present disclosure does not describe all elements of the embodiments, and overlaps between the general contents or the embodiments in the technical field to which the present invention belongs.

This specification does not describe all elements of the exemplary embodiments of the present disclosure and detailed descriptions on what are well known in the art or redundant descriptions on substantially the same configurations may be omitted. The terms 'part,' 'module,' 'member,' 'block' used in the specification may be implemented in software or hardware, and a plurality of 'parts, modules, members, blocks' may be embodied as one component. It is also possible that one 'part,' 'module,' 'member,' 'block' includes a plurality of components.

Throughout the specification, when an element is referred to as being "connected to" another element, it may be directly or indirectly connected to the other element and the "indirectly connected to" includes being connected to the other element via a wireless communication network.

In addition, when a part is said to "include" a certain component, this means that it may further include other components, unless otherwise stated.

Throughout the specification, when a member is located "on" another member, this includes not only when one member is in contact with another member but also when another member exists between the two members.

The terms first, second, etc. are used to distinguish one component from another component, and the component is not limited by the terms described above.

Singular expressions include plural expressions unless the context clearly indicates an exception.

In each step, the identification code is used for convenience of description, and the identification code does not describe the order of each step. Each of the steps may be performed out of the stated order unless the context clearly dictates the specific order.

Hereinafter with reference to the accompanying drawings will be described the working principle and embodiments of the present invention.

Figure 1:
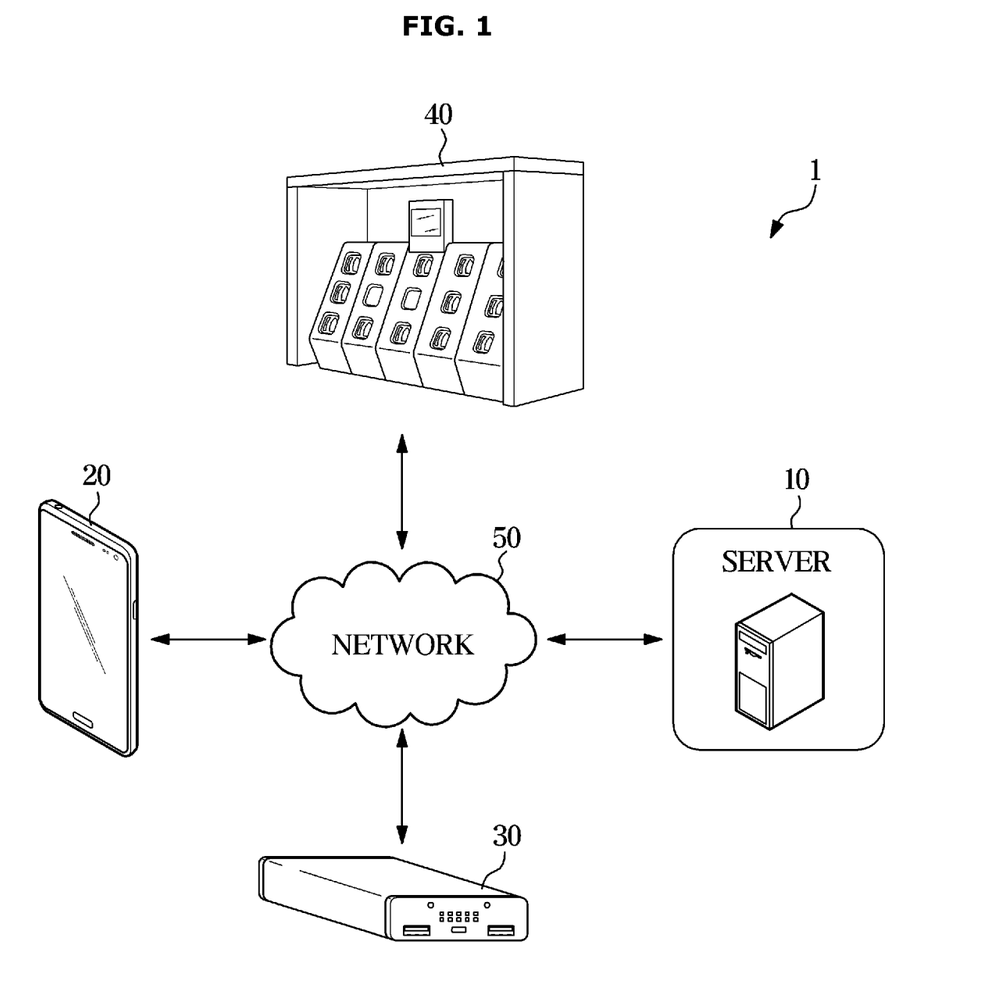
FIG. 1 illustrates a block diagram of a configuration of a battery distribution system according to an embodiment.

FIG. 1 illustrates a block diagram of a configuration of a battery distribution system according to an embodiment.

Referring to FIG. 1, the battery distribution system 1 according to an embodiment includes a battery 30, a charging station 40 for charging the battery 30, a user terminal 20 for requesting use of the battery 30, and a server 10 that recommends a battery 30 suitable for a user or suggests redistribution of the battery 30.

The server 10 according to an embodiment may receive status information of each of the plurality of batteries 30 from each battery 30 or the charging station 40, and may receive user information, such as information on a target device that the user intends to use, from the user terminal 20.

The server 10 according to an embodiment may recommend a battery 30 suitable for the user based on the battery status information and the user information, and propose the battery redistribution based on the battery status information and the location information of the battery 30.

The user terminal 20 according to an embodiment may correspond to a wireless terminal or a wired terminal, and may receive an input from a user, transmit and receive information with the server 10, and display information through a display.

The battery 30 according to an exemplary embodiment may correspond to a secondary battery, and may provide electric power to a personal mobility such as an electric bicycle, an electric kickboard, and an electric motorcycle. The battery 30 may include a communication module corresponding to a known wireless communication protocol according to an embodiment, and may transmit its own status information to the server 10. In this case, the battery 30 includes a battery management system (BMS) module, and the BMS module may generate and store state information such as the number of charge/discharge times, charge capacity, output voltage, and use history.

The charging station 40 according to an embodiment may be provided with a plurality of sockets, and may charge the battery 30 by supplying power to the battery 30 connected to the socket. The charging station 40 may include a communication module corresponding to a known wired or wireless communication protocol, according to an embodiment, and the state information transmitted from the battery 30 may be transmitted to the server 10 when the battery 30 is connected.

The server 10, the user terminal 20, the battery 30, and the charging station 40 may transmit and receive information through a network 50.

Figure 2:
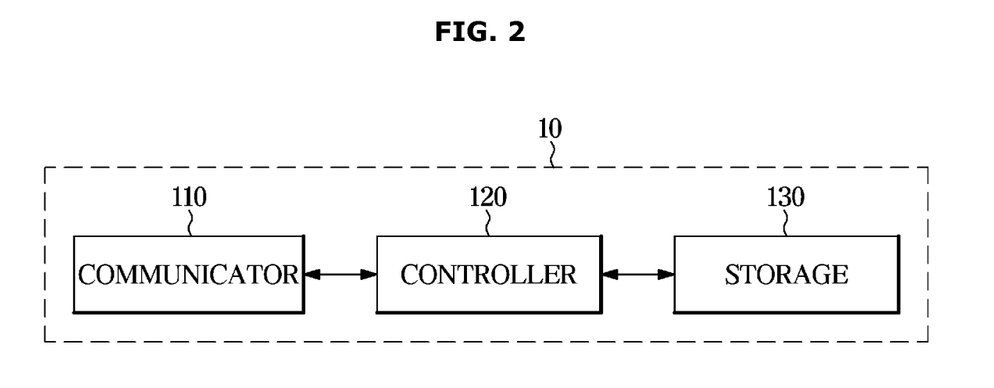
FIG. 2 illustrates a control block diagram of a server according to an embodiment.

FIG. 2 illustrates a control block diagram of the server 10 according to an embodiment.

Referring to FIG. 2, the server 10 according to one embodiment includes a communicator no for performing communication with the external device, a controller 120 that recommends a battery 30 suitable for a user or suggests redistribution of the battery 30, and a storage 130 that stores information necessary for control.

The communicator no according to an embodiment may perform wired or wireless communication with the user terminal 20, the battery 30, or the charging station 40 and the network 50. To this end, the communicator no may include a communication module corresponding to a known wired or wireless protocol.

The controller 120 according to an embodiment may obtain status information of each of the plurality of batteries 30 from each of the batteries 30 or from the charging station 40 through the communicator 110.

That is, when the battery 30 is connected to the charging station 40 and charged, the battery 30 may transmit its status information to the server 10 through an internal communication module. In addition, according to an embodiment, the charging station 40 may receive status information from the connected battery 30 and transmit the status information to the server 10.

In this case, the battery status information may include at least one of information on the number of times of charging and discharging, information on a usage history, information on a maximum charging capacity, and information on an output voltage.

The controller 120 according to an embodiment may obtain information on the target device from the user terminal 20 through the communicator 110.

In this case, the target device may correspond to a personal mobility that the user intends to use, and the information on the target device may correspond to information on the type of the target device.

That is, the user terminal 20 may transmit a request for use of the battery 30 to the server 10 based on a user input, and the request for use may include information on a target device.

The controller 120 according to an embodiment may determine a battery having a lifespan corresponding to the required output of the target device among the plurality of batteries 30 as the recommended battery based on the battery status information and the target device information, and control the communicator no to transmit information on the recommended battery to the user terminal 20.

In this case, the controller 120 may determine the lifespan of each of the plurality of batteries 30 based on the battery status information.

The life of the battery 30 may be represented by a state of health (SOH), and may be calculated in consideration of the degree of deterioration compared to the initial state. Determination of the lifespan of the battery 30 will be described in detail later.

Also, the controller 120 may determine the required power of the target device based on the information of the target device. That is, the controller 120 may determine the required power corresponding to each type of target device.

The controller 120 may further consider the driving history information of the user corresponding to the user terminal 20 received from the user terminal 20 or previously stored, or separately determine the required power of the target device using only the driving history information. Determination of the required power of the target device will be described in detail later.

The information on the recommended battery may include identification information for specifying the recommended battery and location information indicating the location of the recommended battery.

The controller 120 according to an embodiment may determine a battery 30 located within a preset distance from the user terminal 20 as a recommended battery while having a lifespan corresponding to the required output of the target device when determining the recommended battery, in consideration of the location information of the user terminal 20.

The controller 120 according to an embodiment may determine a rental fee in proportion to the life of the battery 30.

For example, the controller 120 may adjust the rental fee in the direction of increasing when the user uses the battery 30 having a longer life than the recommended battery, and adjust the rental fee in the direction of reducing the rental fee when the user uses the battery 30 having a shorter life than the recommended battery.

The controller 120 may determine at least one of a type or a usage method of a target device corresponding to each of the plurality of batteries 30 based on the battery status information, and may control the communicator 110 to transmit information on at least one of the determined target device type or usage method to the user terminal 20.

That is, the controller 120 may determine the personal mobility required for output corresponding to the lifespan of the battery 30 as the type of the target device, and determine the minimum maintenance charge capacity corresponding to the lifespan of the battery 30, thereby to decide how to use it. Providing a method of use may be to provide a minimum remaining charge amount that the battery 30 must maintain during use.

According to an embodiment, the controller 120 may provide at least one of a target device type or a usage method corresponding to a lifespan only for the battery 30 selected from the user terminal 20.

The controller 120 according to an embodiment may determine the battery output state for each region based on location information and state information of each of the plurality of batteries 30.

That is, the controller 120 may determine whether the battery output is high or low for each region based on location information and status information (information on usage history) of each of the plurality of batteries 30. In other words, the controller 120 may determine whether a large amount of capacity or a small amount of capacity is consumed when the battery 30 is used based on the information on the usage history, and may determine whether the output amount of the battery 30 is high or low for each region in consideration of location information.

Thereafter, the controller 120 determines a redistribution region of each of the plurality of batteries 30 based on the battery output state and the battery status information for each region, and controls the communicator no to transmit information on the redistribution region to an external device.

That is, the controller 120 may propose redistributing the battery 30 having a long life to an area having a high battery output, and redistributing the battery 30 having a short lifespan to an area having a low battery output.

The external device may correspond to a terminal of an administrator who manages the distribution of the battery 30, and according to an embodiment, the server 10 may directly output a redistribution proposal including a user interface (not shown).

The controller 120 may include at least one memory in which a program for performing the above-described operation and an operation described later is stored, and at least one processor for executing the stored program. When there are a plurality of memories and processors, they may be integrated on one chip, or may be provided in physically separate locations.

The storage 130 according to an embodiment may store various types of information necessary for control, such as information on a correlation between saddle status information and a lifespan, information on a correlation between the lifespan of the battery 30 and user information, etc. For this purpose, the storage 130 may be provided with a known type of storage medium.

In the above, various configurations of the server 10 have been described. Hereinafter, the server 10 recommending the battery 30 or proposing redistribution of the battery 30 will be described in detail.

Figure 3:
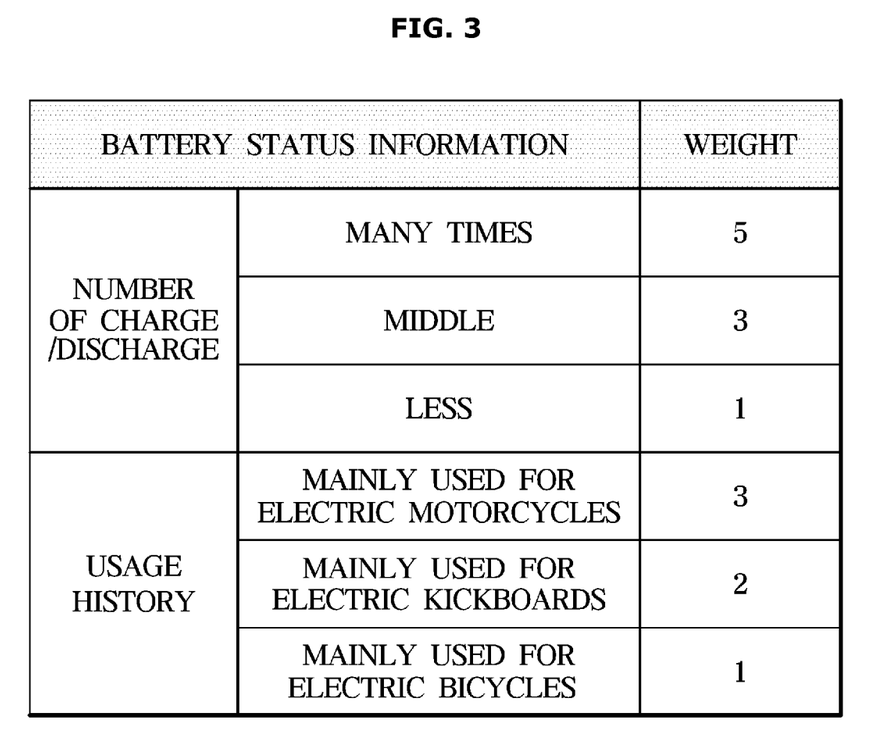
FIG. 3 is a diagram for describing a case in which a server determines a battery life based on battery state information according to an embodiment.

FIG. 3 is a diagram for explaining a case in which the server 10 determines the lifespan of the battery 30 based on the battery status information according to an embodiment of the present invention.

The controller 120 according to an embodiment may obtain status information of each of the plurality of batteries 30 from each of the batteries 30 or from the charging station 40 through the communicator 110.

That is, when the battery 30 is connected to the charging station 40 and charged, the battery 30 may transmit its status information to the server 10 through an internal communication module. In addition, according to an embodiment, the charging station 40 may receive status information from the connected battery 30 and transmit the status information to the server 10.

In this case, the battery status information may include at least one of information about the number of times of charging and discharging, information about a usage history, information about a maximum charging capacity, and information about an output voltage.

The controller 120 according to an embodiment may determine the lifespan of each of the plurality of batteries 30 based on the battery status information.

The life of the battery 30 may be represented by a state of health (SOH), and may be calculated in consideration of the degree of deterioration compared to the initial state (e.g., 100% life). That is, the life of the battery 30 may be reduced depending on use based on the initial life (100%), so it can be seen that the battery 30 having a short lifespan due to the shortened lifespan has been deteriorated compared to the battery 30 having a long lifespan.

Specifically, the controller 120 may assign a weight based on the battery status information, and may determine the life of the battery 30 according to the size of the weight. For example, as illustrated in FIG. 3, the controller 120 may determine that deterioration in the battery 30 increases as the number of times of charging and discharging increases, so that a higher weight may be assigned.

In addition, the controller 120 may differentially give weights according to the type of target device mainly used based on the usage history. This is because the output differs depending on the type of target device. That is, the controller 120 may determine that the deterioration increases as it is mainly used for a target device that requires high output, and thus may assign a high weight. For example, as shown in FIG. 3, the controller 120 may give a higher weight to the battery 30 mainly used for an electric kickboard than the battery 30 mainly used for an electric bicycle, and may give a higher weight to the battery 30 mainly used in the electric motorcycle than the battery 30 mainly used in the electric kickboard.

The controller 120 may assign a weight for each item included in the saddle status information and determine the life of the battery 30 by synthesizing the weight for each item. For example, the controller 120 may classify the lifespan of the battery 30 based on a value obtained by summing or multiplying weights corresponding to each item included in the battery status information. In this case, the controller 120 may use information on a correlation between the total weight value stored in the storage 130 and the life of the battery 30.

In this way, the controller 120 may classify the lifespan of the battery 30 by synthesizing the weights assigned to each item included in the saddle status information. For example, the controller 120 may classify the battery 30 with more than 70% of its life remaining as class A, the battery 30 with more than 50% life and less than 70% remaining as class B, and the battery 30 with less than 50% life remaining can be classified as class C.

In addition to the example illustrated in FIG. 3, the controller 120 may determine that deterioration has progressed as the output voltage decreases based on information on the output voltage among the saddle status information, and may give a higher weight corresponding to the output voltage information. In addition, the controller 120 may determine that deterioration has progressed as the maximum charging capacity decreases based on information on the maximum charging capacity among the battery status information, and may give a higher weight corresponding to the maximum charging capacity information. However, the controller 120 may determine the life of the battery 30 by further considering a known factor capable of determining battery deterioration in addition to the above example of the battery status information.

Figure 4:
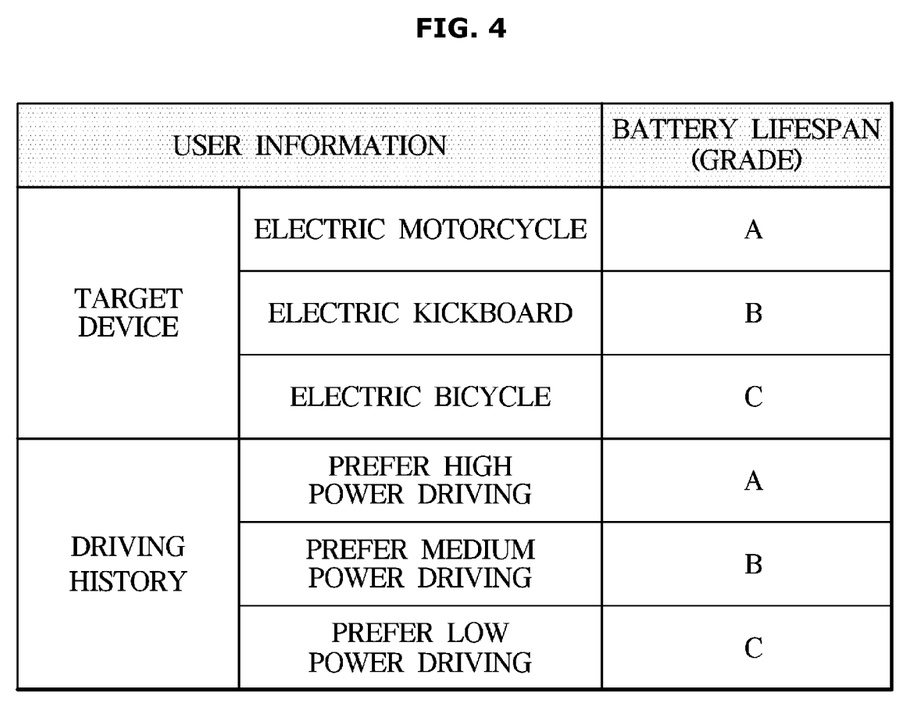
FIG. 4 is a diagram illustrating a case in which a server determines a recommended battery according to an embodiment.
Figure 5:
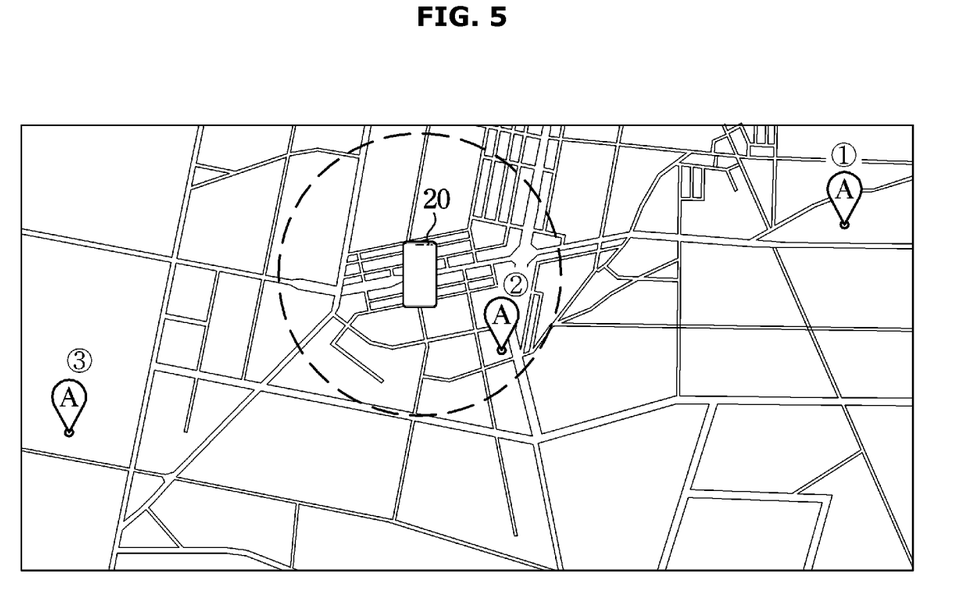
FIG. 5 is a diagram for describing a case in which a server determines a recommended battery based on a location of a battery according to an embodiment.

FIG. 4 is a diagram illustrating a case in which a server determines a recommended battery according to an embodiment. FIG. 5 is a diagram for describing a case in which a server 10 determines a recommended battery 30 based on a location of a battery according to an embodiment.

The controller 120 according to an embodiment may obtain information on the target device from the user terminal 20 through the communicator 110.

In this case, the target device may correspond to a personal mobility that the user intends to use, and the information on the target device may correspond to information on the type of the target device.

That is, the user terminal 20 may transmit a request for use of the battery 30 to the server 10 based on a user input, and the request for use may include information on a target device.

The controller 120 may determine a battery having a lifespan corresponding to the required output of the target device among the plurality of batteries 30 as the recommended battery based on saddle status information and target device information, and may control the communicator 110 to transmit information of the recommended battery to the user terminal 20.

That is, the controller 120 compares the lifespan of each of the plurality of batteries 30 determined based on the battery status information with the required output of the target device, and determines as the recommended battery that which has a lifespan corresponding to the required output of the target device among the plurality of batteries 30. In this case, the controller 120 may determine the required power of the target device based on the information on the target device. In other words, the controller 120 may determine the required power corresponding to each type of target device.

Specifically, the controller 120 may determine a battery 30 that has a longer life as the target device requiring higher output as the recommended battery. For example, as illustrated in FIG. 4, when the target device is an electric bicycle, the controller 120 may determine a C-class battery 30 having a short battery life as the recommended battery. That is, when the target device is an electric bicycle, the controller 120 may determine the C-class battery 30 represented by a low output as the recommended battery by considering the fact that the electric bicycle of the PAS (pedal assist system) type has low required power, so that it is possible to drive even when the life of the battery 30 remains short.

In addition, as shown in FIG. 4, the controller 120 may determine a B-class battery 30 as a recommended battery when the target device is an electric kickboard, and may determine the A-class battery 30 with a long remaining life as a recommended battery if the target device is an electric motorcycle that requires a high output.

The controller 120 may further consider the driving history information of the user corresponding to the user terminal 20 received from the user terminal 20 or previously stored, or separately determine the required power of the target device using only the driving history information.

That is, the controller 120 may determine a high required output of the target device when the user prefers high-power driving based on the user's driving history, and determine the required power of the target device to be low when the user prefers low-power driving. Finally, according to an embodiment, the controller 120 may recommend the A-class battery 30, which has a long lifespan, as a recommended battery for a user who prefers high-power driving, and recommend the C-class battery 30, which has a short lifespan, as a recommended battery for a user who prefers low-power driving.

In this case, the information on the recommended battery may include identification information for specifying the recommended battery and location information indicating the location of the recommended battery.

Also, according to an embodiment, the controller 120 may determine a battery 30 located within a preset distance from the user terminal 20 as a recommended battery while having a lifespan corresponding to the required output of the target device when determining the recommended battery, by further considering the location information of the user terminal 20.

For example, the controller 120 may determine a specific battery (e.g., ②) located at a preset distance from the user terminal 20 as the recommended battery among a plurality of batteries (ex: ①, ②, ③) that have a lifespan corresponding to the required output of the target device (ex: Class A).

Figure 6:
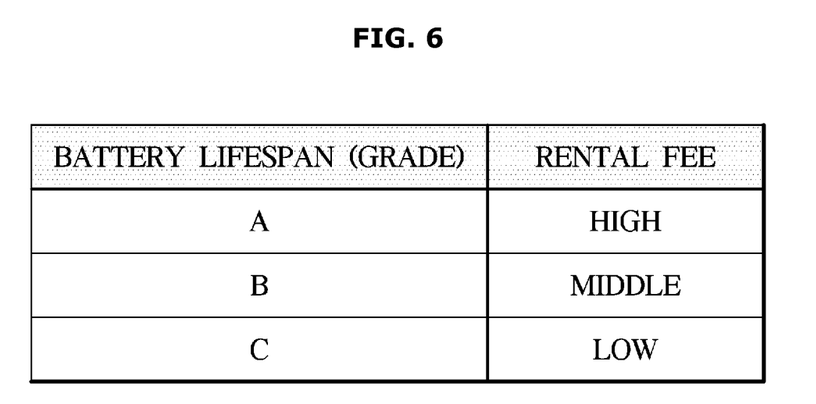
FIG. 6 is a diagram for explaining a case in which a server according to an embodiment determines a rental fee according to a battery life.

FIG. 6 is a diagram for explaining a case in which a server 10 according to an embodiment determines a rental fee according to a lifespan of the battery 30.

Referring to FIG. 6, the controller 120 according to an embodiment may determine a rental fee in proportion to the life of the battery 30.

That is, the controller 120 may set a higher rental fee for the A-class battery 30, which has a long lifespan, compared to the rental fee for the B-class battery 30, which has a relatively short lifespan. In addition, the controller 120 may set the rental fee for the B-class battery 30 higher than the rental fee for the C-class battery 30, which has a relatively shorter lifespan.

For example, the controller 120 can adjust the rental fee to increase when the user uses a battery with a longer life (e.g., A class battery) than the recommended battery (e.g., B class battery) and can adjust the rental fee to decrease when a user uses a battery with a shorter lifespan (e.g., C class battery) than the recommended battery (e.g., B class battery).

Figure 7:
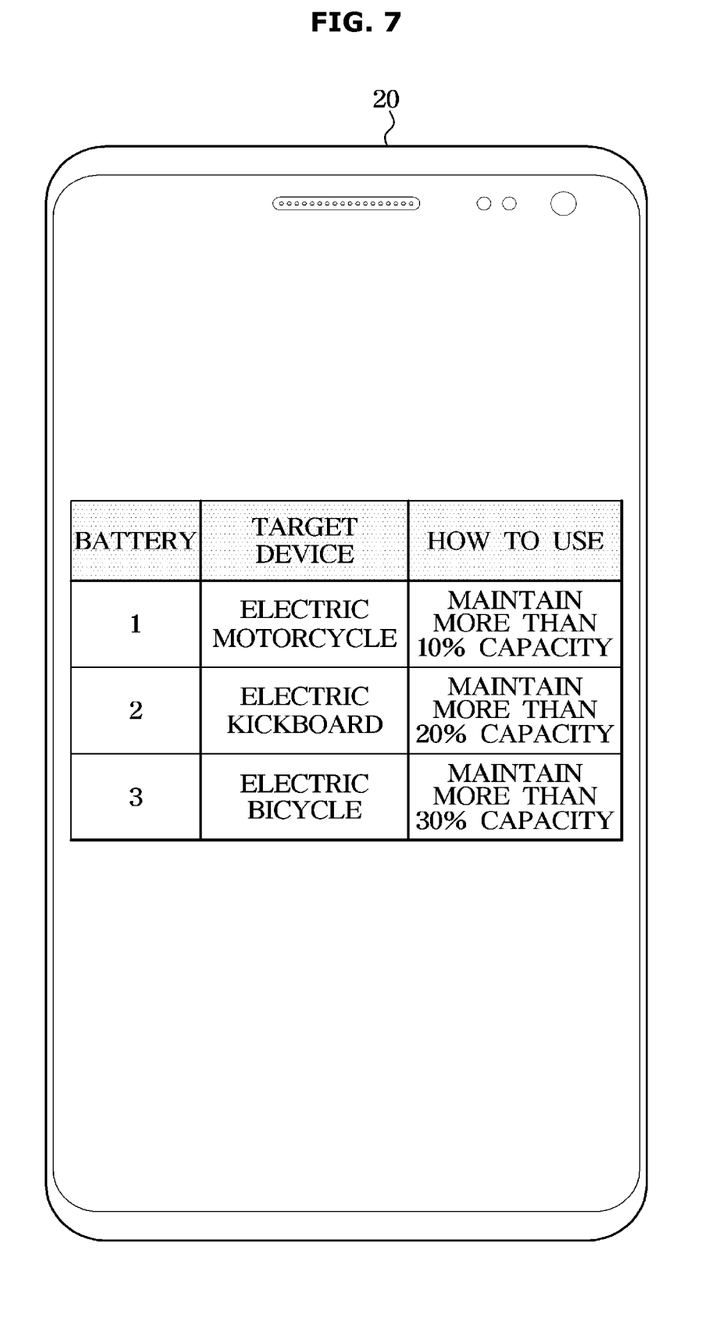
FIG. 7 is a diagram for explaining a case in which a user terminal displays a target device type and usage method for each battery according to an embodiment.

FIG. 7 is a diagram for explaining a case in which a user terminal 20 displays a target device type and usage method for each battery 30 according to an embodiment.

The controller 120 according to an embodiment may determine at least one of a type or a usage method of a target device corresponding to each of the plurality of batteries 30 based on the battery status information, and may control the communicator no to transmit information on at least one of the determined target device type or usage method to the user terminal 20.

That is, the controller 120 may determine a personal mobility having a required output corresponding to the life of the battery 30 as the type of the target device, and may determine a corresponding usage method by determining the minimum maintenance charge capacity corresponding to the life of the battery 30 to provide a minimum remaining charge amount that the battery 30 must maintain during use.

Through this, the user terminal 20 may display at least one of a type or usage method of a target device recommended for each battery 30.

For example, the user terminal 20 may display the electric motorcycle as the type of the target device with respect to the "battery 1" remaining with a long life, and indicate that the minimum maintenance charge capacity is maintained at 10% or more as a usage method. In addition, the user terminal 20 may display the electric kickboard as the type of the target device for the "battery 2" remaining with a shorter life, and indicate that the minimum maintenance charge capacity is maintained at 20% or more as a usage method. In addition, the user terminal 20 may display the electric bicycle as the type of the target device for the "battery 3" remaining with a shorter life, and indicate that the minimum maintenance charge capacity is maintained at 30% or more as a usage method.

Figure 8:
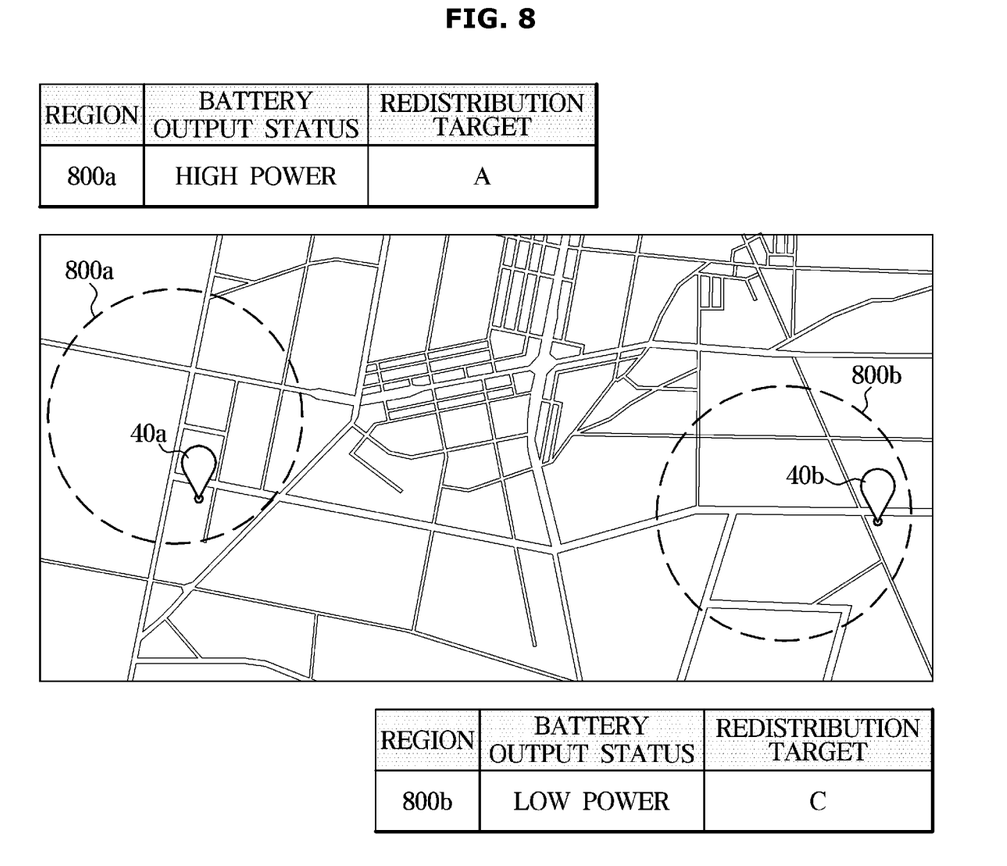
FIG. 8 is a diagram illustrating a case in which a server according to an embodiment determines a redistribution area of a battery according to a battery output state.

FIG. 8 is a diagram illustrating a case in which a server 10 according to an embodiment determines a redistribution area of a battery 30 according to a battery output state.

The controller 120 according to an embodiment may determine the battery output state for each region based on location information and state information of each of the plurality of batteries 30.

That is, the controller 120 may determine whether the battery output is high or low for each region based on location information and status information (information on usage history) of each of the plurality of batteries 30. In other words, the controller 120 may determine whether a large amount of capacity or a small amount of capacity is consumed when the battery 30 is used based on the information on the usage history, and may determine whether the output amount of the battery 30 is high or low for each region by considering the location information.

Thereafter, the controller 120 may control the communicator 110 to determine a redistribution region of each of the plurality of batteries 30 based on the battery output state and battery status information for each region and transmit information on the redistribution region to an external device.

That is, the controller 120 may propose redistributing the battery 30 having a long life to an area having a high battery output, and redistributing the battery 30 having a short lifespan to an area having a low battery output.

For example, the controller 120 may propose to redistribute the A-class battery 30, which has a long lifespan, to the charging station 40*a* of the region 800*a* with high battery output, and may propose to redistribute the C-class battery 30, which has a short lifespan, to the charging station 40*b* of the corresponding region 800*b* having low battery output.

The external device may correspond to a terminal of an administrator who manages the distribution of the battery 30, and according to an embodiment, the server 10 may directly output a redistribution proposal including a user interface (not shown).

Hereinafter, a method of controlling the server 10 according to an embodiment will be described. The server 10 according to the above-described embodiments may be applied to a method of controlling the server 10 to be described later. Accordingly, the contents described above with reference to FIGS. 1 to 8 are equally applicable to the control method of the server 10 according to an exemplary embodiment, even if there is no special mention.

Figure 9:
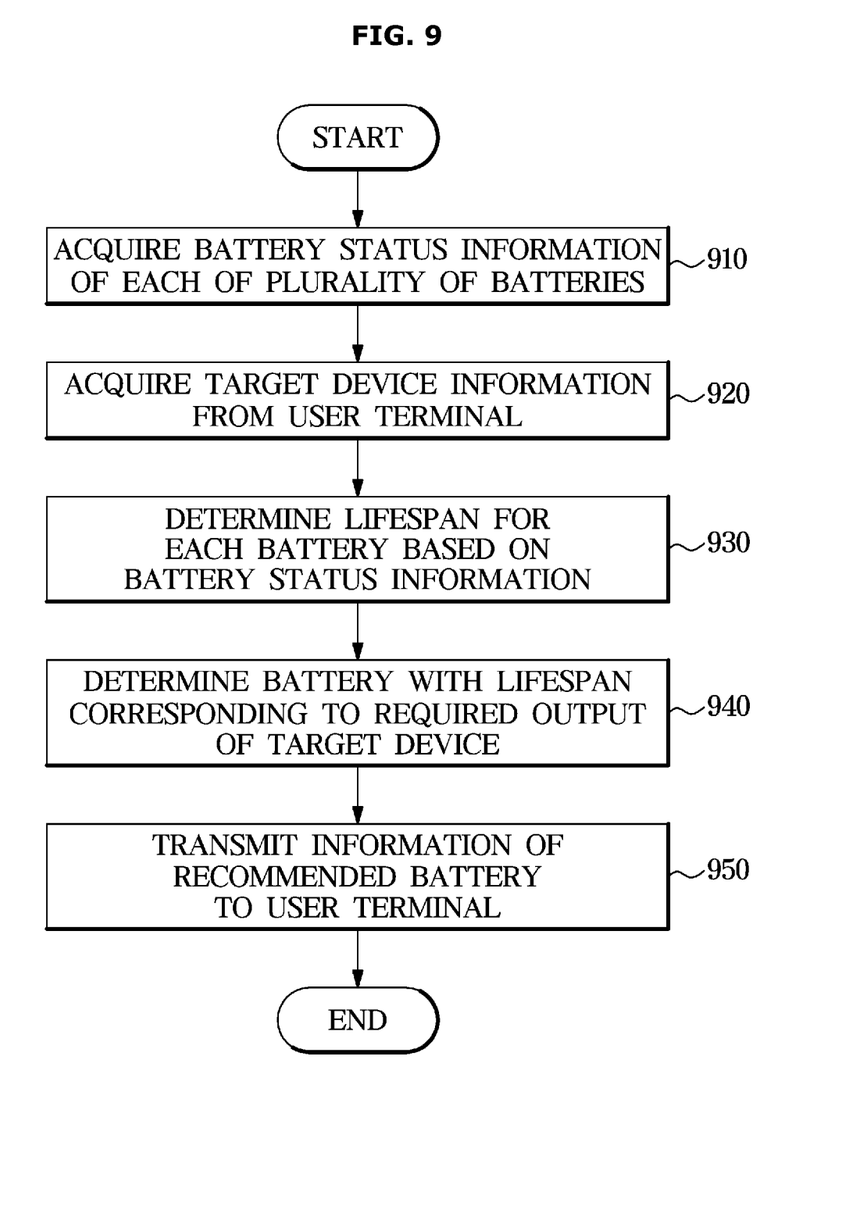
FIG. 9 is a flowchart illustrating a case of determining a recommended battery among a control method of a server according to an embodiment.

FIG. 9 is a flowchart illustrating a case of determining a recommended battery among a control method of a server according to an embodiment.

Referring to FIG. 9, the server 10 according to an embodiment may acquire battery status information of each of the plurality of batteries 30 (910).

That is, the controller 120 may obtain state information of each of the plurality of batteries 30 from each of the batteries 30 or from the charging station 40 through the communicator 110.

In this case, when the battery 30 is connected to the charging station 40 and charged, the battery 30 may transmit its own status information to the server 10 through an internal communication module. In addition, according to an embodiment, the charging station 40 may receive status information from the connected battery 30 and transmit the status information to the server 10.

In this case, the battery status information may include at least one of information on the number of times of charging and discharging, information on a usage history, information on a maximum charging capacity, and information on an output voltage.

The server 10 according to an embodiment may obtain target device information from the user terminal 20 (920).

In this case, the target device may correspond to a personal mobility that the user wants to use, and the information on the target device may correspond to information on the type of the target device.

That is, the user terminal 20 may transmit a request for use of the battery 30 to the server 10 based on a user input, and the request for use may include information on a target device.

The server 10 according to an embodiment may determine the life of each battery 30 based on the battery status information (930).

The controller 120 may determine the lifespan of each of the plurality of batteries 30 based on the battery status information.

The life of the battery 30 may be represented by a state of health (SOH), and may be calculated in consideration of the degree of deterioration compared to the initial state.

The server 10 according to an embodiment may determine a battery having a lifespan corresponding to the required output of the target device as the recommended battery (940), and may transmit information on the recommended battery to the user terminal 20 (950).

That is, the controller 120 may determine a battery having a lifespan corresponding to the required output of the target device among the plurality of batteries 30 as the recommended battery based on the saddle status information and the target device information, and control the communicator no to transmit information on the recommended battery to the user terminal 20.

In this case, the controller 120 may determine the required power of the target device based on the information on the target device. That is, the controller 120 may determine the required power corresponding to each type of target device.

The controller 120 may separately determine the required power of the target device using only the driving history information or further considering the driving history information of the user corresponding to the user terminal 20 received from the user terminal 20 or previously stored.

The information on the recommended battery may include identification information for specifying the recommended battery and location information indicating the location of the recommended battery.

In addition, the controller 120 may determine a battery 30 located within a preset distance from the user terminal 20 as a recommended battery while having a lifespan corresponding to the required output of the target device when determining the recommended battery, in consideration of the location information of the user terminal 20.

Figure 10:
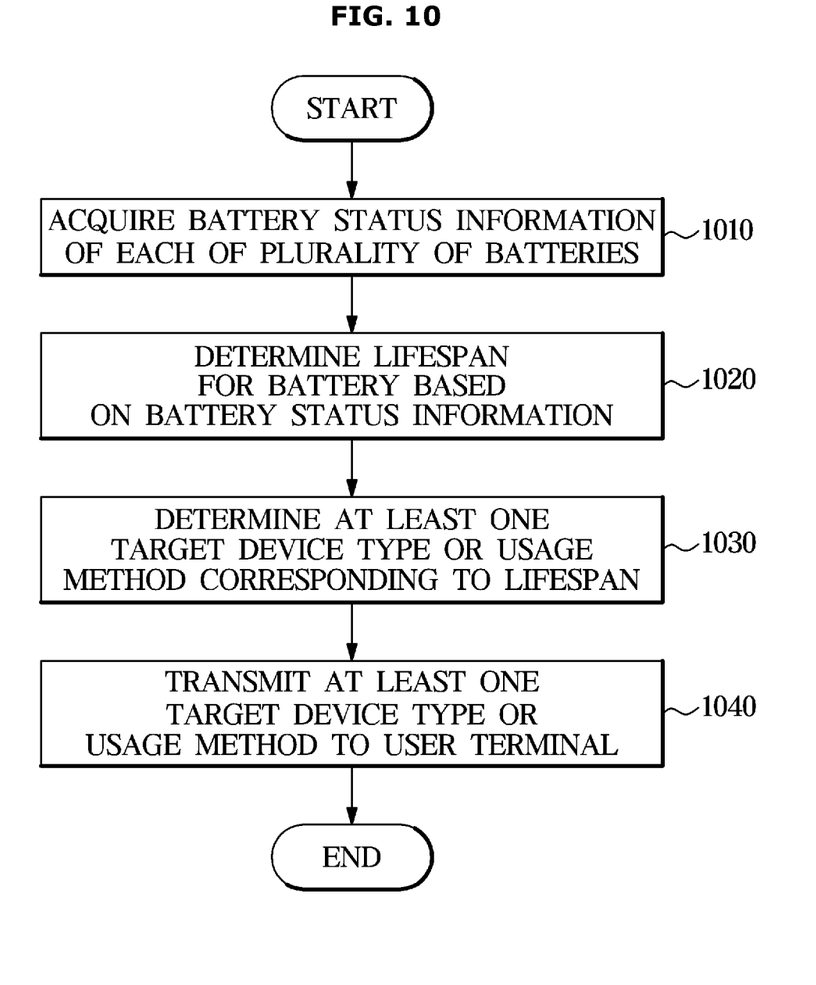
FIG. 10 is a flowchart illustrating a case of providing a target device type and a usage method corresponding to the life of a battery among a control method of a server according to an embodiment.

FIG. 10 is a flowchart illustrating a case of providing a target device type and a usage method corresponding to the life of a battery among a control method of a server 10 according to an embodiment.

Referring to FIG. 10, the server 10 according to an embodiment may acquire the battery status information of each of the plurality of batteries 30, as described in FIG. 9 (1010), and determine the lifespan of each battery 30 based on the battery status information (1020).

The server 10 according to an embodiment may determine at least one of a target device type or a usage method corresponding to the lifespan (1030), and transmit at least one of a target device type or a usage method to the user terminal 20 (1040).

The controller 120 according to an embodiment may determine at least one of a target device type or a usage method of a target device corresponding to each of the plurality of batteries 30 on the basis of the battery status information, and may control the communicator no to transmit information on at least one of the determined target device type or usage method to the user terminal 20.

That is, the controller 120 may determine a personal mobility required for output corresponding to the life of the battery 30 as the type of the target device, and by determining the minimum maintenance charge capacity corresponding to the life of the battery 30, a corresponding usage method can be determined. Providing a method of use may be to provide a minimum remaining charge amount that the battery 30 must maintain during use.

Figure 11:
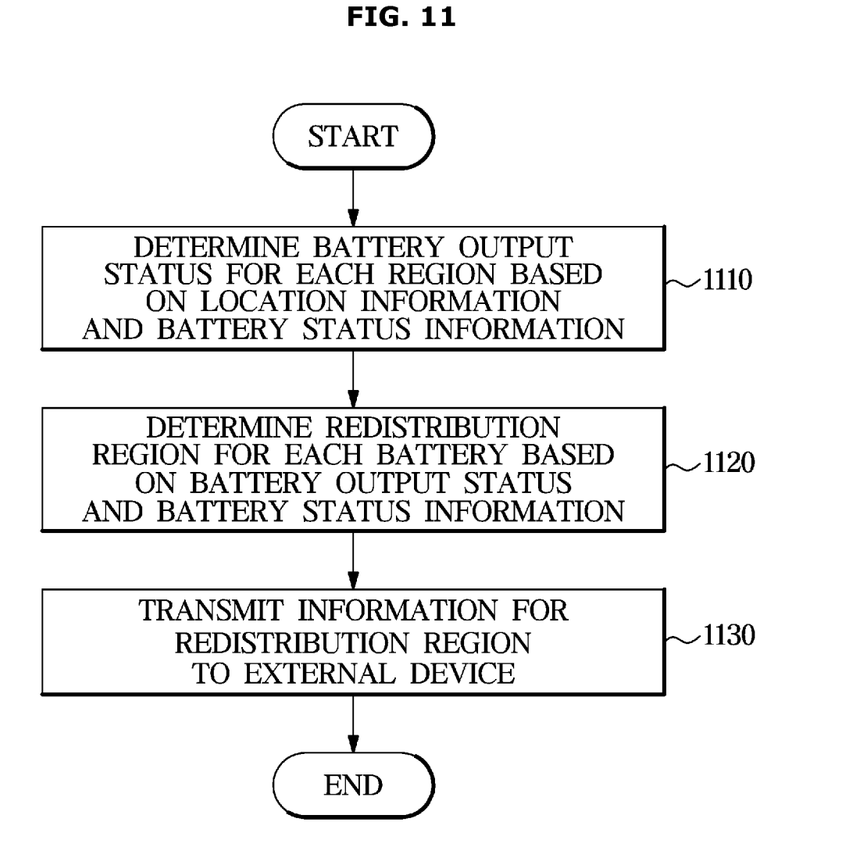
FIG. 11 is a flowchart illustrating a case of proposing battery redistribution based on an output state of a battery in a control method of a server according to an embodiment.

FIG. 11 is a flowchart illustrating a case of proposing battery redistribution based on an output state of a battery 30 in a control method of a server 10 according to an embodiment.

Referring to FIG. 11, the server 10 according to an embodiment may determine a battery output state for each region based on location information and battery status information (1110).

That is, the controller 120 may determine whether the battery output is high or low for each region based on location information and status information (information on usage history) of each of the plurality of batteries 30. In other words, the controller 120 may determine whether a large amount of capacity or a small amount of capacity is consumed when the battery 30 is used based on the information on the usage history, and may determine whether the output amount of the battery 30 is high or low for each region in consideration of location information.

The server 10 according to an embodiment may determine a redistribution area for each battery 30 based on the battery output status and battery status information (1120), and may transmit information about the redistribution area to an external device (1130).

That is, the controller 120 may propose redistributing the battery 30 having a long life to an area having a high battery output, and redistributing the battery 30 having a short lifespan to an area having a low battery output.

The external device may correspond to a terminal of an administrator who manages the distribution of the battery 30, and according to an embodiment, the server 10 may directly output a redistribution proposal including a user interface (not shown).

Non-transitory computer-readable recording mediums include all types of recording media storing data readable by a computer system. Examples of the computer-readable recording medium include a Read Only Memory (ROM), a Random Access Memory (RAM), a magnetic tape, a magnetic disk, a flash memory, an optical data storage device, or the like.

Although a few exemplary embodiments of the present disclosure have been shown and described, it would be appreciated by those skilled in the art that changes may be made in these exemplary embodiments without departing from the principles and spirit of the disclosure, the scope of which is defined in the claims and their equivalents.

In accordance with an aspect of the present disclosure, by providing a battery suitable for a user according to the battery state and the type of the device to be used, and suggesting a redistribution area according to the battery state, the server can provide users with optimized batteries quickly and accurately, therefore a user satisfaction can be increased.

What is claimed is:

1. A server, comprising:
   a communicator; and
   a controller configured to acquire battery status information of each of a plurality of batteries through the communicator, acquire target device information from a user terminal through the communicator, determine a battery from the plurality of batteries having a lifespan corresponding to a required output of a target device among the plurality of batteries as a recommended battery based on the battery status information and the target device information, and control the communicator to transmit information on the recommended battery to the user terminal;
   wherein the controller is configured to determine a target device type and a usage method corresponding to each of the plurality of batteries based on the battery state information, and control the communicator to transmit the determined target device type and the usage method to the user terminal; and
   wherein the controller is configured to determine a personal mobility having a required output corresponding to the life of the battery as the type of the target device, and determine a corresponding usage method by determining a minimum maintenance charge capacity corresponding to the life of the battery to provide a minimum remaining charge amount that the battery must maintain during use.

2. The server according to claim 1, wherein the battery status information includes at least one of charge/discharge count information, usage history information, maximum charge capacity information, and output voltage information.

3. The server according to claim 2, wherein the controller is configured to determine the lifespan of each of the plurality of batteries based on the battery status information.

4. The server according to claim 1, wherein the controller is configured to receive driving history information of a user from the user terminal through the communicator.

5. The server according to claim 4, wherein the controller is configured to determine a required power of the target device based on at least one of the target device information and the driving history information.

6. The server according to claim 1, wherein the controller is configured to determine the battery having the lifespan corresponding to the required output of the target device and located within a preset distance from the user terminal as the recommended battery based on location information of the user terminal.

7. The server according to claim 1, wherein the controller is configured to determine a battery rental fee proportional to the lifespan.

8. The server according to claim 7, wherein the controller is configured to increase the battery rental fee for a battery having a longer lifespan than the recommended battery, and to decrease the battery rental fee for a battery having a shorter lifespan than the recommended battery.

9. The server according to claim 1, wherein the controller is configured to determine a battery output state for each region based on location information and the battery status information of each of the plurality of batteries, determine a redistribution region of each of the plurality of batteries based on the battery output state and the battery status information for each region, and control the communicator to transmit information on the redistribution region to an external device.

10. A method of controlling a server that includes a communicator, the method comprising:
   acquiring battery status information of each of a plurality of batteries through the communicator;
   acquiring target device information from a user terminal through the communicator;
   determining a personal mobility having a required output corresponding to the life of the battery as a type of the target device;
   determining a corresponding usage method by determining a minimum maintenance charge capacity corresponding to the life of the battery to provide a minimum remaining charge amount that the battery must maintain during use;
   determining the target device type and a usage method corresponding to each of the plurality of batteries based on the battery status information;
   controlling the communicator to transmit the determined target device type and the usage method to the user terminal;
   determining a battery from the plurality of batteries having a lifespan corresponding to a required output of the target device as a recommended battery based on the battery status information and the target device information; and controlling the communicator to transmit information related to the recommended battery to the user terminal.

11. The method according to claim 10, wherein the battery status information includes at least one of charge/discharge count information, usage history information, maximum charge capacity information, and output voltage information.

12. The method according to claim 11, wherein determining the battery as the recommended battery includes determining the lifespan of each of the plurality of batteries based on the battery status information.

13. The method according to claim 12, wherein determining the battery as the recommended battery includes determining the battery having the lifespan corresponding to the required output of the target device and located within a preset distance from the user terminal as the recommended battery based on location information of the user terminal.

14. The method according to claim 10, further comprising receiving driving history information of a user from the user terminal through the communicator.

15. The method according to claim 14, wherein determining the battery as the recommended battery includes determining a required power of the target device based on at least one of the target device information and the driving history information.

16. The method according to claim 10, further comprising determining a battery rental fee proportional to the lifespan.

17. The method according to claim 16, wherein determining the battery rental fee includes:
increasing the battery rental fee for a battery having a longer lifespan than the recommended battery; and
decreasing the battery rental fee for a battery having a shorter lifespan than the recommended battery.

18. The method of according to claim 10, further comprising:
determining a battery output state for each region based on location information and the battery status information of each of the plurality of batteries;
determining a redistribution region of each of the plurality of batteries based on the battery output state and the battery status information for each region; and
controlling the communicator to transmit information on the redistribution region to an external device.

* * * * *